United States Patent [19]

Ohsawa

[11] 4,074,075
[45] Feb. 14, 1978

[54] CIRCUIT FOR DEMODULATING A STEREO SIGNAL

[75] Inventor: Mitsuo Ohsawa, Fujisawa, Japan

[73] Assignee: Sony Corporation, Tokyo, Japan

[21] Appl. No.: 736,306

[22] Filed: Oct. 28, 1976

[30] Foreign Application Priority Data

Oct. 30, 1975 Japan ................................ 50-130917

[51] Int. Cl.² ............................................... H04H 5/00
[52] U.S. Cl. .................................. 179/15 BT; 329/167
[58] Field of Search ............ 179/15 BT, 1 G; 325/36; 329/163, 167

[56] References Cited

U.S. PATENT DOCUMENTS

| | | | |
|---|---|---|---|
| 3,707,603 | 12/1972 | Limberg | 179/15 BT |
| 3,798,376 | 3/1974 | Limberg | 179/15 BT |
| 3,947,645 | 3/1976 | Mizukami et al. | 179/15 BT |
| 3,985,964 | 10/1976 | Ohkubo et al. | 179/15 BT |

*Primary Examiner*—Douglas W. Olms
*Attorney, Agent, or Firm*—Lewis H. Eslinger; Alvin Sinderbrand

[57] ABSTRACT

A circuit for demodulating a composite stereo signal of the type including a main-channel (L+R) signal and a sub-channel (L−R) signal to derive therefrom individual channel information signals L and R, respectively. A switching circuit of the balanced-modulator type is supplied with the composite stereo signal at one set of input terminals and with a switching signal whose frequency is equal to the sub-carrier onto which the sub-channel (L−R) signal is modulated, at another set of input terminals. The switching circuit produces oppositely-phased sub-channel signals which are applied to first and second current generators, respectively. An amplifier is supplied with the composite stereo signal to amplify the main-channel (L+R) signal, the amplifier including a channel separation control to adjustably vary the currents flowing through the amplifier so as to correspondingly vary the main-channel (L+R) currents. The main-channel currents produced by the amplifier and the oppositely-phased sub-channel currents produced by the current generators are supplied to respective output terminals whereat they are combined to produce the separate channel information signals L and R with minimum crosstalk.

8 Claims, 4 Drawing Figures

CIRCUIT FOR DEMODULATING A STEREO SIGNAL

BACKGROUND OF THE INVENTION

This invention relates to a circuit for use as a stereo demodulating circuit and, more particularly, to such a circuit wherein a received composite stereo signal formed of a main-channel signal and a sub-channel signal is demodulated to produce separate channel information signals with minimum crosstalk therebetween.

In conventional stereophonic signal broadcasting systems wherein left and right channel information signals L and R are combined to be transmitted via radio broadcast transmission, the separate channel signals are combined in a particular manner so as to produce a composite stereo signal formed of a main-channel (L+R) signal and a sub-channel (L−R) signal. The sub-channel signal is modulated with a sub-carrier, typically of a frequency equal to 38 kHz. This broadcasted composite stereo signal thus can be received by conventional monophonic receiving apparatus wherein only the main-channel (L+R) signal is detected. However, stereo receiving apparatus includes circuitry for detecting the main-channel (L+R) signal and the sub-channel (L−R) signal and then to matrix these detected signals so as to derive therefrom the separated L-channel information and R channel information. Thus, the composite stereo signal is transmitted in an arrangement that is compatible both with stereo receiving apparatus and with monophonic receiving apparatus.

One type of stereo demodulating circuit that can be used to receive the composite stereo signal and derive therefrom the separate L channel and R channel information signals is of the so-called double-balanced modulator type. This demodulating circuit includes a first differential amplifier formed of a first pair of transistors, a second differential amplifier formed of a second pair of transistors whose emitter electrodes are connected in common to the collector electrode of one transistor in the first differential amplifier, and a third differential amplifier formed of a third pair of transistors whose emitter electrodes are connected in common to the collector electrode of the other transistor in the first differential amplifier. The composite stereo signal, which may be received from a radio broadcast, is applied to one transistor in the first differential amplifier, while the other transistor in that differential amplifier is connected in the common-base configuration. A switching signal whose frequency is equal to the frequency of the sub-carrier onto which the sub-channel (L−R) signal is modulated is applied to each of the second and third differential amplifiers. In operation, the collector electrode of one transistor in the second differential amplifier produces the L-channel signal while the collector electrode of the other transistor in that differential amplifier produces the R-channel signal. Also, the collector electrode of one transistor in the third differential amplifier produces the −R-channel signal while the collector electrode of the other transistor in that differential amplifier produces the −L-channel signal.

However, crosstalk components may be present in each of the individual channel signals. That is, the L-channel signal may produce unwanted crosstalk components corresponding to the R-channel signal, and vice versa. To suppress such crosstalk components, selected ones of the collector electrodes of the transistors forming the second and third differential amplifiers are connected in common so as to produce a (L−R) signal at one output terminal and a −(L−R) signal at a second output terminal. In addition, an adjustable resistor is provided in the emitter circuit of the transistors forming the first differential amplifier; this adjustable resistor serving to vary the ratio of the currents flowing through the respective transistors in the first differential amplifier and, correspondingly, the ratio of the currents flowing through the second and third differential amplifiers. If this ratio, or separation constant, which is a function of the adjustable resistor, is selected so as to be equal to the crosstalk components, a cancellation thereof will be attained at the respective output terminals of the demodulating circuit. For example, if the signal produced at the collector electrode of one transistor in the second differential amplifier is represented as (L+ΔR), that is, this signal is the left-channel signal provided with a crosstalk component of the right-channel, and if the collector electrode of one transistor included in the third differential amplifier produces the signal (R+ΔL), that is, the right-channel signal plus a crosstalk component of the left-channel, then the signal produced by connecting these collector electrodes to a common junction is equal to (L+ΔR)−(R+ΔL). Now, the level of the right-channel signal (plus the crosstalk component of the left channel) is a function of the separation constant as determined by the adjustable resistor. Stated otherwise, the signal produced at the junction defined by the common-connected collector electrodes is equal to (L+ΔR)−k(R+ΔL). Accordingly, if the separation constant $k$ is selected to be substantially equal to Δ, then the right channel crosstalk component ΔR will be cancelled. A similar crosstalk suppression operation is provided at the other output terminal of the stereo demodulating circuit.

However, in the stereo demodulating circuit of the type just described, if the adjustable resistor included in the emitter circuit of the transistors forming the first differential amplifier is varied, then the DC component of the transistor emitter currents likewise is varied. Hence, this causes a similar variation in the DC level of the left-channel and right-channel signals which are derived at the demodulating circuit output terminals. Another disadvantage of this type of demodulating circuit is that the gain thereof is constrained to relatively lower levels. This is because the gain of the demodulating circuit is a function of the gain of the second and third differential amplifiers which, in turn, is related to the resistance values of the load resistors thereof. Hence, since the resistance values cannot be very high, the overall gain of the demodulating circuit likewise cannot be high.

Another disadvantage attending the aforedescribed stereo demodulating circuit is the limitation on the dynamic range when nominal power supply voltages are used. That is, if the power supply voltage is selected to be not greater than about 18 to 20 volts DC, then this limitation coupled with the constraint on the resistance value of the differential amplifier load resistors results in a limited dynamic range. Furthermore, if the stereo demodulating circuit is used with apparatus that is energized by a commercial power distribution system, then the presence of hum and noise on the AC power lines may be reflected in the DC power supply voltage and, consequently, will be detected at the output terminals of the demodulating circuit. This has a deteriorating effect upon the signal-to-noise (S/N) ratio. Also, the stereo demodulating circuit of the aforedescribed type tends to distort the higher harmonics in the L-channel and R-channel information signals.

OBJECTS OF THE INVENTION

Therefore, it is an object of the present invention to provide an improved stereo demodulating circuit that avoids the disadvantages and defects inherent in the aforedescribed stereo demodulating circuit.

Another object of this invention is to provide a circuit that can be used as a stereo demodulating circuit, or stereo decoder, wherein separate channel information signals are derived from a received composite stereo signal, and wherein crosstalk components in these separate channel information signals are substantially suppressed.

A further object of this invention is to provide an improved stereo demodulating circuit that includes an adjustable channel-separation control for cancelling crosstalk components in the derived left-channel and right-channel information signals.

Another object of this invention is to provide an improved stereo demodulating circuit having an adjustable channel-separation control and wherein the DC level of the derived left and right channel signals is not affected by adjusting this separation control.

An additional object of this invention is to provide a stereo demodulating circuit having a wide dynamic range and high gain.

A still further object of the present invention is to provide a stereo demodulating circuit wherein hum and noise that might be present on the AC power lines is not reflected in the channel output signals.

Yet another object of this invention is to provide a stereo demodulating circuit of the double-balanced mixer type whose DC operating point can be selected at virtually any desired location without accompanying distortion, so that the direct current flowing therein can be selected at any arbitrary value that is independent of the setting of a channel-separation adjustment control.

Another object of this invention is to provide an improved stereo demodulating circuit that can be readily manufactured as a monolithic integrated circuit.

Various other objects, advantages and features of this invention will become readily apparent from the ensuing detailed description, and the novel features will be particularly pointed out in the appended claims.

SUMMARY OF THE INVENTION

In accordance with this invention, a circuit that can be used as a stereo demodulating circuit is formed of a demodulator for deriving sub-channel (L−R) and −(L−R) signals from a received composite stereo signal, an amplifier for amplifying at least the main-channel (L+R) signal, the amplifier including a channel-separation control, a pair of current generators for generating currents proportional to the derived, respective sub-channel signals, and separate channel output terminals which are supplied with a respective one sub-channel current and an amplified, separation-adjusted main-channel current for producing individual L and R channel information signals that are substantially free of crosstalk components.

In a preferred embodiment, the demodulator is of the double-balanced mixer type including a first differential amplifier across which the composite stereo signal is applied in oppositely-phased relation and whose outputs are connected to second and third differential amplifiers, respectively, each of these latter differential amplifiers being supplied with the switching signal which is applied thereacross in oppositely-phased relation. The outputs of the second and third differential amplifiers are interconnected and coupled to the current generators, respectively. The main-channel signal amplifier is formed of a first pair of differentially-connected transistors which are connected to a pair of constant current sources, respectively, and a second pair of differentially-connected transistors which are connected in parallel with the first pair of transistors. The channel-separation adjustment is interconnected between these constant current sources.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT OF THE PRESENT INVENTION

Prior Art Stereo Demodulating Circuit

Figure 1:
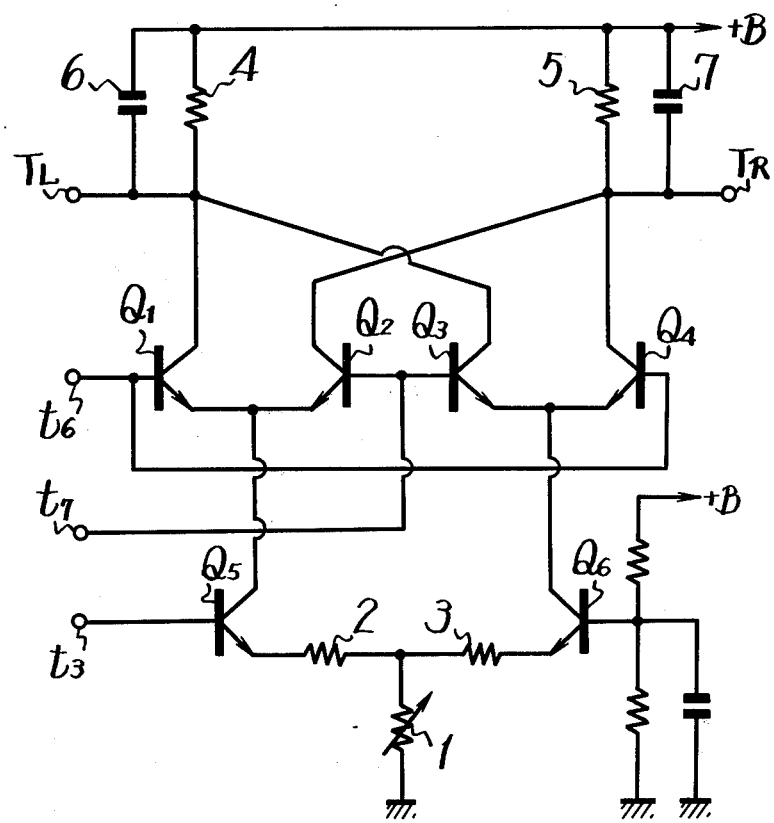
FIG. 1 is a schematic diagram of a prior art stereo demodulating circuit of the type described hereinabove.

An embodiment of the prior art stereo demodulating circuit described hereinabove is illustrated in FIG. 1. This circuit is a balanced mixer formed of a first differential amplifier including differentially-connected transistors $Q_5$ and $Q_6$, a second differential amplifier including differentially-connected transistors $Q_1$ and $Q_2$, and a third differential amplifier including differentially-connected transistors $Q_3$ and $Q_4$. An input terminal $t_3$ adapted to be supplied with the composite stereo signal is connected to the base electrode of transistor $Q_5$ in the first differential amplifier. As is conventional, the composite stereo signal includes a main-channel (L+R) signal and a sub-channel (L−R) signal, the sub-channel signal being modulated onto a sub-carrier of, for example, 38 kHz. Input terminals $t_6$ and $t_7$ are adapted to receive a switching signal whose frequency is equal to the sub-carrier frequency of 38 kHz, this switching signal being applied to terminals $t_6$ and $t_7$ in oppositely-phased relation. Input terminals $t_6$ and $t_7$ are connected to the base electrodes of transistors $Q_1$ and $Q_2$, respectively, in the second differential amplifier, and to the base electrodes of transistors $Q_4$ and $Q_3$, respectively, in the third differential amplifier.

The common-connected emitter electrodes of transistors $Q_1$ and $Q_2$ are connected to the collector electrode of transistor $Q_5$, and the common-connected electrodes of transistors $Q_3$ and $Q_4$ are connected to the collector electrode of transistor $Q_6$. The emitter electrodes of transistors $Q_5$ and $Q_6$ are interconnected by series resistors 2 and 3, and the junction defined by these resistors is connected to a reference potential, such as ground, by an adjustable resistor 1. Preferably, transistors $Q_5$ and $Q_6$ are matched, and resistors 2 and 3 are of equal resistance values. As shown, the base electrode of transistor $Q_6$ is supplied with a substantially constant bias potential and, therefore, this transistor operates in the groundedbase mode. That is, the input signal supplied to transistor $Q_6$ is applied thereto via its emitter circuit.

The collector electrodes of transistors $Q_1$ and $Q_3$ are connected to a common junction to which the left-channel output terminal $T_L$ is coupled, and the collector electrodes of transistors $Q_2$ and $Q_4$ are connected to a common junction to which the right-channel output terminal $T_R$ is coupled. A load resistor 4 is connected to the collector electrodes of transistors $Q_1$ and $Q_3$, and a load resistor 5 is connected to the collector electrodes of transistors $Q_2$ and $Q_4$. By-pass capacitors 6 and 7 are connected in parallel with load resistors 4 and 5, respectively, for by-bassing higher frequency signal components. When the composite stereo signal applied to input terminal $t_3$ turns transistor $Q_5$ ON, a left-channel signal L is produced at the collector electrode of transistor $Q_1$ when the switching signal applied to input terminal $t_6$ is positive and a right-channel signal R is produced at the collector electrode of transistor $Q_2$ when the switching signal applied to input terminal $t_7$ is positive. However, the left-channel signal L may be provided with a right-channel crosstalk component $\Delta R$ and, similarly, the right-channel signal R may be provided with a left-channel crosstalk component $\Delta L$. Also, when the composite stereo signal applied to input terminal $t_3$ turns transistor $Q_6$ ON, an oppositely-phased right-channel signal $-R$ is produced at the collector electrode of transistor $Q_3$ when the switching signal applied to input terminal $t_7$ is positive, and an oppositely-phased left-channel signal $-L$ is produced at the collector electrode of transistor $Q_4$ when the switching signal applied to input terminal $t_6$ is positive. However, the right-channel signal $-R$ at the collector electrode of transistor $Q_3$ is provided with a left-channel crosstalk component $-\Delta L$, and the left-channel signal $-L$ at the collector electrode of transistor $Q_4$ is provided with a right-channel crosstalk component $-\Delta R$.

The composite stereo signal applied as an input signal to transistor $Q_6$ via its emitter circuit is attenuated by the divider formed of resistors 1 and 2. Consequently, the left and right channel signals produced by the operation of transistors $Q_3$, $Q_4$ and $Q_6$ are of a lower level than the left and right channel signals produced by the operation of transistors $Q_1$, $Q_2$ and $Q_5$. Accordingly, the right-channel signal and left-channel crosstalk component at the collector electrode of transistor $Q_3$ may be expressed as $-k(R+\Delta L)$, and the left-channel signal and right-channel crosstalk component at the collector electrode of transistor $Q_4$ may be expressed as $-k(L+\Delta R)$, where $k$ is a function of the attenuation attributed to resistors 1 and 2 and, therefore, is a function of the setting of adjustable resistor 1.

Figure 2:
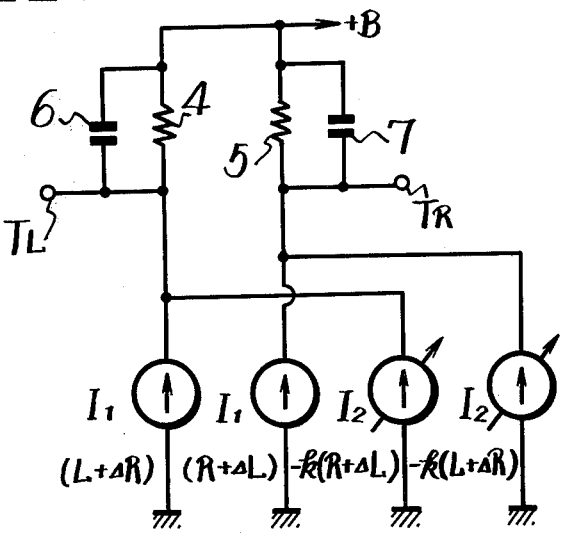
FIG. 2 is a schematic diagram of an equivalent circuit of the prior art stereo demodulating circuit that is useful in explaining the operation of that circuit.

The foregoing can best be appreciated by referring to the equivalent circuit schematically shown in FIG. 2. The collector-emitter current flowing through transistor $Q_1$ can be represented as a constant current source whose DC current is $I_1$ and whose AC, or information current is represented as $(L+\Delta R)$. Similarly, the collector-emitter current flowing through transistor $Q_2$ may be represented as a constant current source whose DC current is $I_1$ and whose AC current is $(R+\Delta L)$. The collector-emitter current flowing through transistor $Q_3$ also may be represented as a constant current source whose DC level is $I_2$ and whose AC level is $-k(R+\Delta L)$. Finally, the collector-emitter current flowing through transistor $Q_4$ may be represented as a constant current source whose DC level is $I_2$ and whose AC level is $-k(L+\Delta R)$. The connection of the collector electrodes of transistors $Q_1$ and $Q_3$ results in a signal at the left-channel output terminal $T_L$ that is equal to $(L+\Delta R) - k(R+\Delta L)$. Similarly, the connection of the collector electrodes of transistors $Q_2$ and $Q_4$ to the right-channel output terminal $T_R$ results in a signal equal to $(R+\Delta L) - k(L+\Delta R)$. When adjustable resistor 1 is set so that the attenuation factor k is equal to $\Delta$, then the right-channel crosstalk component at the left-channel output terminal $T_L$ is cancelled. Similarly, the left-channel crosstalk component at the right-channel output terminal $T_R$ also is cancelled. Thus, adjustable resistor 1 functions as a channel-separation asjustment control. However, the demodulating circuit illustrated in FIG. 1 suffers from the disadvantages mentioned in detail hereinabove.

PREFERRED EMBODIMENT OF THE PRESENT INVENTION

Figure 3:
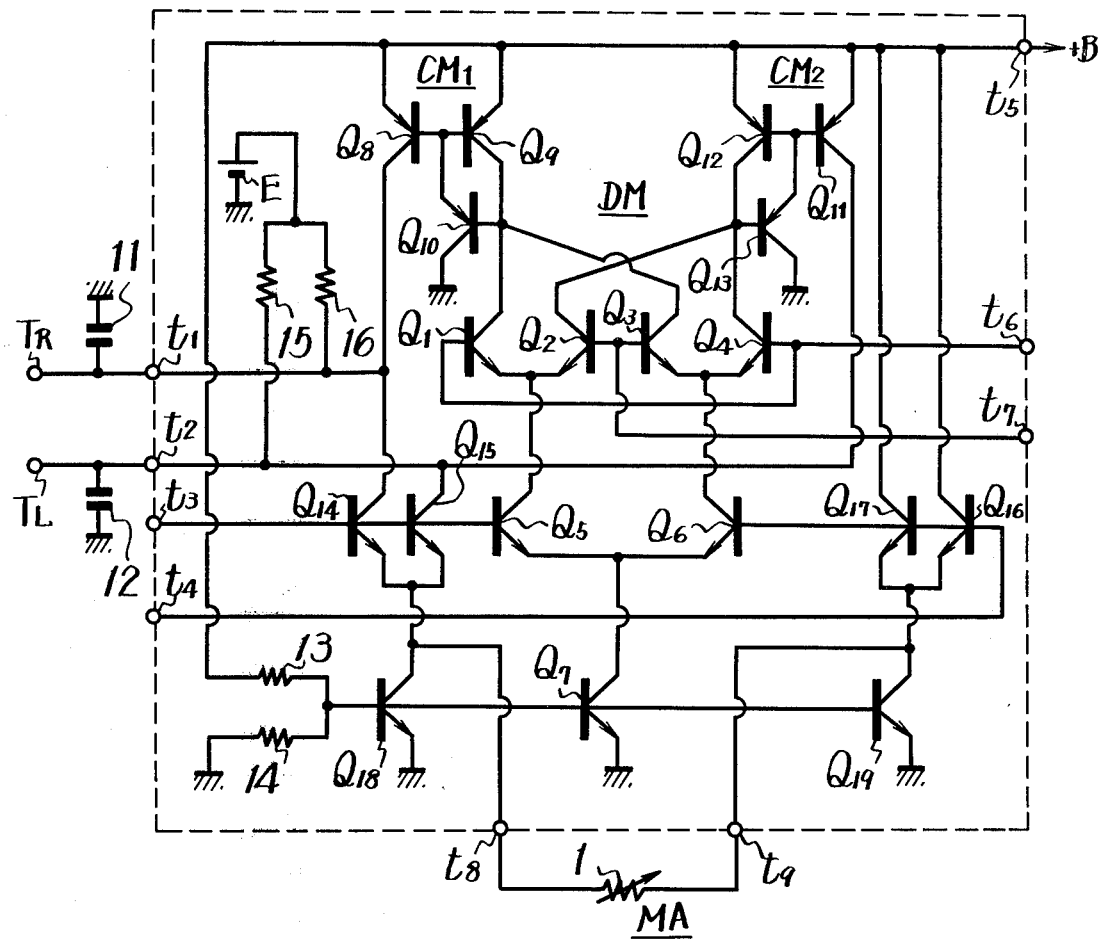
FIG. 3 is a schematic diagram of a preferred embodiment of the present invention.

Turning now to FIG. 3, a circuit that can be used as a stereo demodulating circuit in accordance with the teachings of the present invention is comprised of a demodulator DM, a pair of current generators, such as current mirror circuits, or current relaying circuits $CM_1$ and $CM_2$ and a main-channel signal amplifier MA. Demodulator DM is a switching circuit, such as a double-balanced mixer, having a pair of inputs coupled to composite stereo signal input terminals $t_3$ and $t_4$ so as to receive the composite stereo signal, a pair of switching inputs coupled to switching signal input terminals $t_6$ and $t_7$ so as to receive the switching signal whose frequency is equal to the sub-carrier frequency 38 kHz and a pair of outputs which are connected to the current generators $CM_1$ and $CM_2$, respectively. For convenience, the same reference numerals have been used to identify like component parts in FIGS. 1 and 3. Accordingly, the demodulator is formed of a first differential amplifier comprised of differentially-connected transistors $Q_5$ and $Q_6$ whose base electrodes are connected to input terminals $t_3$ and $t_4$, respectively, so as to receive the composite stereo signal in opposite phase relation. The emitter electrodes of these transistors are connected in common to a constant current source transistor $Q_7$, the base electrode of this latter transistor being supplied with a bias potential supplied by, for example, a bias network formed of resistors 13 and 14 connected across a DC voltage supply represented as $+B$. The DC operating voltage may be applied to a DC source terminal $t_5$, as shown.

Demodulator DM also includes a second differential amplifier formed of the differentially-connected transistors $Q_1$ and $Q_2$, and a third differential amplifier formed of the differentially-connected transistors $Q_3$ and $Q_4$. The emitter electrodes of transistors $Q_1$ and $Q_2$ are connected to the collector electrode of transistor $Q_5$ and the emitter electrodes of transistors $Q_3$ and $Q_4$ are connected to the collector electrode of transistor $Q_6$. Oppositely phased switching signals that are applied to input terminals $t_6$ and $t_7$ are supplied to the base electrodes of transistors $Q_1$ and $Q_2$, respectively, and also to the base electrodes of transistors $Q_4$ and $Q_3$, respectively. Accordingly, during operation, it is expected that the left-channel signal L is produced at the collector electrode of transistor $Q_1$, the right-channel signal R is produced at the collector electrode of transistor $Q_2$, an oppositely-phased right-channel signal $-R$ is produced at the collector electrode of transistor $Q_3$ and an oppositely-phased left-channel signal $-L$ is produced at the collector electrode of transistor $Q_4$. It further is expected that crosstalk components are introduced into each of these L and R signals. The collector electrodes of transistors $Q_1$ and $Q_3$ are connected to a common junction to produce a sub-channel $(L-R)$ signal, and the collector electrodes of transistors $Q_2$ and $Q_4$ are connected to a common junction to produce an oppositely-phased sub-channel $-(L-R)$ signal.

The outputs of demodulator DM are taken from the respective common junctions to which the collector electrodes of transistors $Q_1$, $Q_3$ and $Q_2$, $Q_4$ are connected. Current generator $CM_1$ is connected to one of these outputs and current generator $CM_2$ is connected to the other output. These current generators are of substantially identical construction and, in the interest of brevity, only current generator $CM_1$ will be described. This current generator includes a transistor $Q_9$ whose emitter-collector circuit is connected in series with the collector-emitter circuit of transistor $Q_1$. Another transistor $Q_8$ has its base-emitter circuit connected in parallel with the base-emitter circuit of transistor $Q_9$. Hence, the very same collector current will flow through transistor $Q_8$ as that which flows through the emitter-collector circuit of transistor $Q_9$ if the base-emitter voltages of these transistors are equal. That is, the collector current in transistor $Q_8$ will be equal to the current flowing through transistor $Q_1$ in the second differential amplifier included in demodulator DM and to the current flowing through transistor $Q_3$ in the third differential amplifier included in demodulator DM, since these currents also flow through transistor $Q_9$. Although, for this purpose, transistor $Q_9$ may be connected as a diodeconnected transistor, it is preferred to provide an additional transistor $Q_{10}$ for supplying the base voltage to transistor $Q_8$ and $Q_9$. As shown, the emitter-collector circuit of transistor $Q_{10}$ couples the common-connected base electrodes of transistors $Q_8$ and $Q_9$ to ground, and the base electrode of transistor $Q_{10}$ is connected to the common junction defined by the collector electrodes of transistors $Q_1$ and $Q_3$. The use of additional transistor $Q_{10}$ insures that identical base-emitter voltages will be applied across transistors $Q_8$ and $Q_9$, and any temperature drift will be equally compensated. Hence, the emitter-collector current through transistor $Q_8$ is substantially identical to the emitter-collector current through transistor $Q_9$ and, for current generator $CM_1$, this emitter-collector current is proportional to the sub-channel $(L-R)$ signal.

Since current generator $CM_2$ is of identical construction as just-described current generator $CM_1$, it is appreciated that the emitter-collector current flowing through transistor $Q_{11}$ is proportional to the oppositely-phased sub-channel $-(L-R)$ signal.

The collector electrode of transistor $Q_8$ is connected through a load resistor 16 to an operating voltage source E; and the collector electrode of transistor $Q_{11}$ is connected through a load resistor 15 to the operating voltage source E. In practice, operating voltage source E derives an operating voltage from DC power supply +B. The collector electrodes of transistors $Q_8$ and $Q_{11}$ additionally are coupled to terminals $t_1$ and $t_2$ which, in turn, are connected to the right-channel output terminal $T_R$ and to the left-channel output terminal $T_L$, repectively. Higher frequency component by-pass capacitors 11 and 12 also are coupled to the right-channel and left-channel output terminals, respectively.

Main-channel $(L+R)$ signal amplifier MA is comprised of a pair of differential amplifiers. In particular, transistors $Q_{14}$ and $Q_{16}$ form one differential amplifier, and transistors $Q_{15}$ and $Q_{17}$ form the other differential amplifier. The base electrodes of transistors $Q_{14}$ and $Q_{16}$ are connected in common with the base electrodes of transistors $Q_{15}$ and $Q_{17}$ to input terminals $t_3$ and $t_4$, respectively, so as to receive the oppositely-phased composite stereo signal. The emitter electrodes of transistors $Q_{14}$ and $Q_{16}$ are interconnected by a channel-separation adjustment resistor 1 and, additionally, are connected to respective constant current transistors $Q_{18}$ and $Q_{19}$. Similarly, the emitter electrodes of transistors $Q_{15}$ and $Q_{17}$ are interconnected by channel-separation adjustment resistor 1 and, moreover, are connected to the respective constant current transistors $Q_{18}$ and $Q_{19}$. The latter constant current transistors are supplied with the same bias voltage that is derived from resistors 13 and 4 and that is supplied to constant current transistor $Q_7$.

The collector electrode of transistor $Q_{14}$ is connected to load resistor 16 and to the right-channel output terminal $T_R$. Similarly, the collector electrode of transistor $Q_{15}$ is connected to load resistor 15 and to the left-channel output terminal $T_L$. The collector electrodes of transistors $Q_{16}$ and $Q_{17}$ each are connected directly to power source terminal $t_5$.

Preferably, the illustrated circuit can be constructed as an integrated monolithic circuit. The broken line indicates such a monolithic circuit having respective terminals $t_1$-$t_9$ to which external circuits and signal sources may be applied. Thus, as shown, the channel-separation adjustment resistor 1 is an external resistor interconnected between integrated circuit access terminals $t_8$ and $t_9$.

The operation of the switching circuit comprising demodulator DM will be recognized by one of ordinary skill in the art as producing the left and right channel components that constitute the sub-channel $(L-R)$ signal which is modulated onto the 38 kHz subcarrier included in the composite stereo signal applied to input terminals $t_3$ and $t_4$. That is, when transistor $Q_5$ is turned ON, by the composite stereo signal, a left-channel signal L is produced at the collector electrode of transistor $Q_1$ when the switching signal applied to input terminal $t_6$ is positive and a right-channel signal R is produced at the collector electrode of transistor $Q_2$ when the switching signal applied to input terminal $t_7$ is positive. That is, when transistors $Q_1$ and $Q_5$ are ON, current flowing through transistor $Q_9$, and thus through transistor $Q_8$, is proportional to the left-channel signal L. Similarly, when transistors $Q_2$ and $Q_5$ both are ON, the current flowing through transistor $Q_{12}$, and thus through transistor $Q_{11}$, is proportional to the right-channel signal R.

Now, when the composite stereo signal turns transistor $Q_6$ ON, an oppositely-phased right-channel signal $-R$ is produced at the collector electrode of transistor $Q_3$ when the switching signal applied to input terminal $t_7$ is positive, and an oppositely-phased left-channel signal $-L$ is produced at the collector electrode of transistor $Q_4$ when the switching signal applied to input terminal $t_6$ is positive. Hence, when transistors $Q_3$ and $Q_6$ both are ON, the current flowing through transistor $Q_9$, and thus through transistor $Q_8$, is proportional to the oppositely-phased right-channel signal $-R$. Similarly, when transistors $Q_4$ and $Q_6$ both are ON, the current flowing through transistor $Q_{12}$, and thus through transistor $Q_{11}$, is proportional to the oppositely-phased left-channel $-L$. Therefore, the signal across resistor 16 produced in response to the current flow through transistor $Q_8$ is the sub-channel $(L-R)$ signal; and the signal produced across resistor 15 in response to the current flowing through transistor $Q_{11}$ is the oppositely-phased sub-channel $-(L-R)$ signal.

The stereo composite signal applied to input terminals $t_3$ and $t_4$ also is amplified by the pair of differential amplifiers comprising main-channel amplifier MA. While both the main-channel and sub-channel signals are amplified, since the sub-channel signals are modulated onto a sub-carrier, these amplified sub-channel signals are by-passed by by-pass capacitors 11 and 12. Hence, for the purpose of the present discussion, only the amplified main-channel (L+R) signals need be considered. The differential amplifier formed of transistors $Q_{14}$ and $Q_{16}$ amplifies the main-channel signal such that the current flowing through transistor $Q_{14}$ may be represented as $-(R+L)$. Similarly, since the differential amplifier formed of transistors $Q_{15}$ and $Q_{17}$ is connected in parallel to the just-mentioned differential amplifier, the current flowing through transistor $Q_{15}$ also may be represented as $-(R+L)$.

Figure 4:
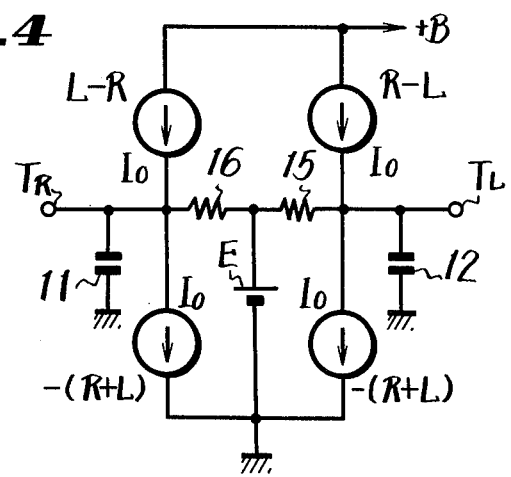
FIG. 4 is a schematic diagram of an equivalent circuit of the demodulating circuit illustrated in FIG. 3.

The effect of the sub-channel currents and main-channel currents supplied to the right-channel output terminal $T_R$ and to the left-channel output terminal $T_L$ may best be seen in the equivalent circuit schematically shown in FIG. 4. The current generated by current generator $CM_1$ is represented as the constant current source whose DC current level is $I_o$ and whose AC current is $(L-R)$. The current through transistor $Q_{14}$ may be represented as a constant current source whose DC level is $I_o$ and whose AC current is $-(R+L)$. These currents are summed at load resistor 16 so as to produce an output signal at the right-channel output terminal $T_R$ equal to $(L-R) - (R+L) = -2R$.

Similarly, the current generated by current generator $CM_2$ may be represented as a constant current source whose DC level is $I_o$ and whose AC current is $(R-L)$. The current flowing through transistor $Q_{15}$ also may be represented as a constant current source whose DC level is $I_o$ and whose AC current is $-(R+L)$. These currents are summed at load resistor 15 so as to produce an output signal at the left-channel output terminal $T_L$ equal to $(R-L) - (R+L) = -2L$.

The currents produced by current generators $CM_1$ and $CM_2$ may include unwanted crosstalk components. Thus, the AC current produced by current generator $CM_1$ may more accurately be represented as $(L+\Delta R-R-\Delta L) = (L-\Delta L-R+\Delta R)$. Similarly, the AC current generated by current generator $CM_2$ may more accurately be represented as $(R+\Delta L-L-\Delta R) = (R-\Delta R-L+\Delta L)$.

Now, in view of the differential action between transistors $Q_{14}$ and $Q_{16}$, the actual current flowing through transistor $Q_{14}$ is dependent upon the setting of channel-separation adjustment resistor 1 which is connected across the constant current transistors $Q_{18}$ and $Q_{19}$. Similarly, because of the differential action between transistors $Q_{15}$ and $Q_{17}$, the actual current flowing through transistor $Q_{15}$ is dependent upon the setting of the channel-separation adjustment resistor. Stated otherwise, the current through each of transistors $Q_{14}$ and $Q_{15}$ may be expressed as $-(R-kR+L-kL)$, where $k$ represents the setting of channel-separation adjustment resistor 1.

The unwanted crosstalk components included in the currents generated by current generators $CM_1$ and $CM_2$ are cancelled in channel separation adjustment resistor 1 is set such that $k = \Delta$. When resistor 1 is so adjusted, the current applied to the right-channel output terminal $T_R$, such as shown in the equivalent circuit of FIG. 4, may be expressed as:

$$[(L+\Delta R)-(R+\Delta L)] - [(R-\Delta R)+(L-\Delta L)]$$

In view of this expression, it is seen that the left-channel crosstalk component $\Delta L$ is cancelled from the right-channel output terminal $T_R$.

Similarly, the currents applied to the left-channel output terminal $T_L$ may be expressed as:

$$[(R+\Delta L)-(L+\Delta R)] - [(R-\Delta R)+(L-\Delta L)]$$

It is seen from this expression that the undesired right-channel crosstalk component $\Delta R$ is cancelled from the left-channel output terminal $T_L$.

It is appreciated that if channel-separation adjustment resistor 1 is varied, this adjustment has no effect upon the current flowing through constant current transistor $Q_7$. Hence, adjustment of resistor 1 does not affect the DC levels of the signals produced at the collector electrodes of transistors $Q_1-Q_4$. Consequently, this defect, which is inherent in the prior art circuit shown in FIG. 1, is avoided. Also, since current generators $CM_1$ and $CM_2$ are used, the constraints on the dynamic range and gain of the prior art demodulating circuit are not found in the improved circuit shown in FIG. 3. Also, the effects of hum and noise that may be present on the AC power lines and which may be reflected in the operating voltage supplied by the DC power supply do not appear at the respective left- and right-channel output terminals $T_L$ and $T_R$. Furthermore, in the embodiment depicted in FIG. 3, distortion in the higher harmonics of the information signals is substantially minimized.

Although the present invention has been described in conjunction with a preferred embodiment thereof, it should be readily apparent that various changes and modifications in form and details can be made without departing from the spirit and scope of the invention. For example, the respective transistors have been illustrated and described as bipolar devices. Such transistors alternatively can be FET's or other conventionl devices and, moreover, each transistor device may be formed of a single such transistor, Darlington-connected transistors or other conventional transistor amplifying devices. Hence, the foregoing designations of base, emitter and collector electrodes have been assumed for the embodiment using single bipolar transistors, and these designations are intended to refer to corresponding electrodes and terminals of other equivalent transistor devices, such as those mentioned above. It is intended that the appended claims be interpreted as including such equivalent devices as well as other changes and modifications that are readily apparent to one of ordinary skill in the art.

What is claimed is:

1. A stereo demodulating circuit for demodulating a composite stereo signal to produce signals representing information contained in individual channels of the composite stereo signal, comprising:
switching means supplied with said composite stereo signal including a main-channel (L+R) signal, a sub-channel (L−R) signal modulated onto a sub-carrier, and a sub-carrier switching signal, said switching means producing oppositely phased sub-channel signals (L−R) and −(L−R), respectively;
first and second current generating means coupled to said switching means for producing first and second currents proportional to said oppositely phased sub-channel signals (L−R) and −(L−R), respectively;

an amplifier supplied with said composite stereo signal for amplifying said main-channel (L+R) signal, said amplifier including a first pair of transistors connected as differential amplifier type switching circuits to first and second current sources, respectively, and a second pair of transistors connected as differential amplifier type switching circuits to said first and second current sources, respectively;

channel separation control means interconnected between said first and second current sources for adjustably varying the currents flowing through said first and second pairs of transistors;

first and second output terminals for producing individual channel information signals L and R, respectively; and means for supplying said first current produced by said first current generating means and a current flowing through said first pair of transistors to said first output terminal, and for supplying said second current produced by said second current generating means and a current flowing through said second pair of transistors to said second output terminal.

2. The stereo demodulating circuit of claim 1 further comprising a source of operating voltage; and wherein one transistor included in said first pair of transistors has its collector electrode coupled to said first output terminal and the other transistor in said first pair of transistors has its collector electrode connected to said source of operating voltage; and wherein one transistor included in said second pair of transistors has its collector electrode coupled to said second output terminal and the other transistor in said second pair of transistors has its collector electrode connected to said source of operating voltage.

3. The stereo demodulating circuit of claim 2 wherein the base electrodes of said one transistor in each said first and second pairs of transistors are connected in common to receive said composite stereo signal; the base electrodes of said other transistor in each said first and second pairs of transistors are connected in common to receive said composite stereo signal in opposite phase; the emitter electrodes of said one transistors are connected in common to said first current source; and the emitter electrodes of said other transistors are connected in common to said second current source.

4. The stereo demodulating circuit of claim 1 wherein said switching means comprises a double-balanced mixer including a first differential amplifier supplied with said composite stereo signal and having first and second outputs; a second differential amplifier coupled to said first output, said second differential amplifier being supplied with said sub-carrier switching signal; a third differential amplifier coupled to said second output, said third differential amplifier being supplied with said sub-carrier switching signal; and switching means output terminals connected to said second and third differential amplifiers and coupled to said first and second current generating means, respectively, for supplying said oppositely-phased sub-channel signals (L−R) and −(L−R).

5. The stereo demodulating circuit of claim 4 wherein said second differential amplifier comprises a third pair of transistors whose emitter electrodes are connected in common to said first output terminal of said first differential amplifier and whose collector electrodes are connected to respective ones of said switching means output terminal; and wherein said third differential amplifier comprises a fourth pair of transistors whose emitter electrodes are connected in common to said second output terminal of said first differential amplifier and whose collector electrodes are connected to respective ones of said switching means output terminals.

6. The stereo demodulating circuit of claim 4 wherein said switching means further comprises a third current source connected to said first differential amplifier; said first, second and third current sources being provided with the same bias voltage.

7. The stereo demodulating circuit of claim 1 wherein each of said first and second current generating means comprises a first transistor whose collector-emitter circuit is connected in series with said switching means; a second transistor whose base-emitter circuit is connected in parallel with the base-emitter circuit of said first transistor; and a third transistor whose emitter electrode is connected to the base electrode of said first and second transistors and whose base electrode is connected to the collector electrode of said first transistor.

8. A circuit for use as a composite signal demodulator to produce output signals representing information contained in individual channels of the composite signal, comprising:

a demodulating circuit for receiving the composite signal formed of a main-channel signal constituted by individual channel information signals and a sub-channel signal constituted by said individual channel information signals, said sub-channel signal being modulated onto a sub-carrier, said demodulating circuit also receiving a switching signal whose frequency is equal to the sub-carrier frequency, and including a first differential amplifier including a pair of stages having a pair of inputs to receive said composite signal applied thereto in opposite phase relation; and second and third differential amplifiers each including a pair of stages having a pair of inputs to receive said switching signal, said second and third differential amplifiers being connected in series with the respective stages of said first differential amplifier;

a first current generating circuit coupled to one stage in each of said second and third differential amplifiers and a second current generating circuit coupled to the other stage in each said second and third differential amplifiers; each said current generating circuit including a first transistor through which flows the current in the respective stages of said second and third differential amplifiers to which said current generating circuit is coupled; and a second transistor whose base-emitter circuit is connected in parallel with the base-emitter circuit of said first transistor;

an amplifier for receiving said composite signal and including fourth and fifth differential amplifiers each including a pair of stages having a pair of inputs supplied with said composite signal applied thereto in opposite phase relation;

one current source connected to one stage in each said fourth and fifth differential amplifiers and another current source connected to the other stage in each said fourth and fifth differential amplifiers; and an adjustable impedance interconnected between said one and other current sources for adjustably varying the currents flowing in the respective stages of said fourth and fifth differential amplifiers; and channel output terminals including a first channel output terminal coupled to the collector-emitter circuit of said second transistor included in said first current generating circuit and to said one stage included in said fourth differential amplifier to receive combined currents therefrom;

a second channel output terminal coupled to the collector-emitter circuit of said second transistor included in said second current generating circuit and to said one stage included in said fifth differential amplifier to receive combined currents therefrom; and higher frequency by-pass means coupled to said output terminals.

* * * * *